United States Patent [19]
Tanaka

[11] Patent Number: 6,028,812
[45] Date of Patent: Feb. 22, 2000

[54] SEMICONDUCTOR MEMORY DEVICE AND METHOD FOR CONTROLLING THE SAME

[75] Inventor: Hidehiko Tanaka, Nara, Japan

[73] Assignee: Sharp Kabushiki Kaisha, Osaka, Japan

[21] Appl. No.: 09/261,734

[22] Filed: Mar. 3, 1999

[30] Foreign Application Priority Data

Mar. 3, 1998 [JP] Japan .................................. 10-051138

[51] Int. Cl.[7] .................................................. G11C 7/00
[52] U.S. Cl. ...................... 365/230.03; 365/205; 365/208
[58] Field of Search ............................. 365/230.03, 205, 365/207, 208

[56] References Cited

U.S. PATENT DOCUMENTS

| | | | |
|---|---|---|---|
| 5,311,469 | 5/1994 | Hoshi et al. ............................. | 365/208 |
| 5,684,736 | 11/1997 | Chan ...................................... | 365/208 |
| 5,781,488 | 7/1998 | Liu et al. ................................ | 365/207 |

FOREIGN PATENT DOCUMENTS

8-031169  2/1996  Japan .

*Primary Examiner*—Vu A. Le
*Attorney, Agent, or Firm*—Morrison & Forester LLP

[57] ABSTRACT

A semiconductor memory device includes at least two memory cells included in a first bank; at least two word lines; and a first sensing amplifier and a second sensing amplifier. The first sensing amplifier amplifies and holds data of one of the memory cells connected to one of the word lines. The second sensing amplifier amplifies and holds data of one other memory cell connected to one other word line.

10 Claims, 7 Drawing Sheets

SEMICONDUCTOR MEMORY DEVICE AND METHOD FOR CONTROLLING THE SAME

BACKGROUND OF THE INVENTION

1. Field of the Invention

The present invention relates to a semiconductor memory device, specifically a synchronous semiconductor memory device operating in synchronization with a clock and a method for controlling the same.

2. Description of the Related Art

Figure 6:
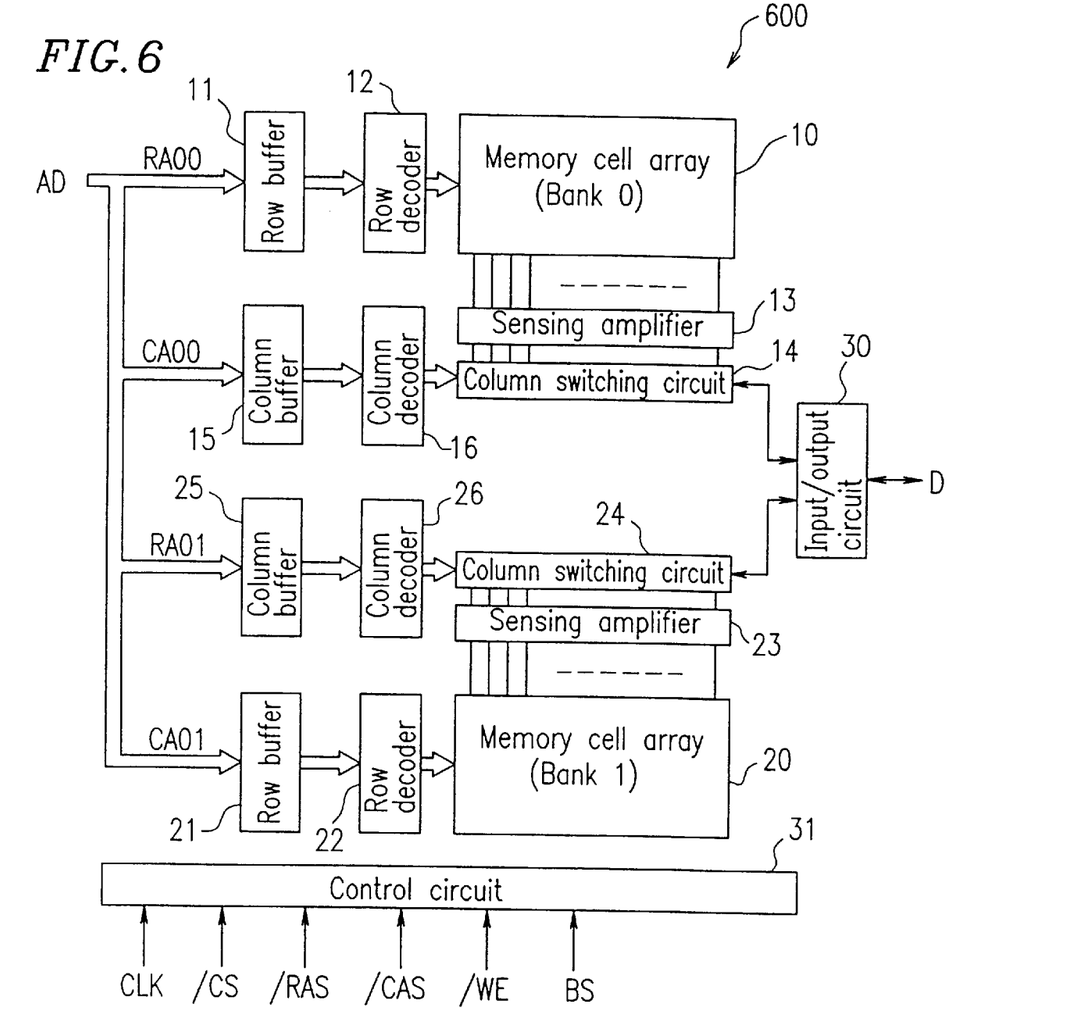
FIG. 6 a block diagram of a general synchronous DRAM.

FIG. 6 is a block diagram of a general synchronous DRAM 600. The synchronous DRAM 600 includes a memory cell array 10 included in a bank 0, a memory cell array 20 included in a bank 1, row buffers 11 and 21, row decoders 12 and 22, column buffers 15 and 25, column decoders 16 and 26, sensing amplifiers 13 and 23, column switching circuits 14 and 24, an input/output circuit 30, and a control circuit 31.

The synchronous DRAM 600 causes a command to be set or causes data to be input thereto or output therefrom in synchronization with a rising edge of a clock CLK supplied from an external device. An access time period until first data is accessed is substantially the same in the synchronous DRAM 600 and a non-synchronous DRAM. In the synchronous DRAM 600, data in a plurality of memory cells connected to one, same word line can be read at a high speed on a clock-by-clock basis.

In the synchronous DRAM 600, a pre-charge time period can be hidden by alternately reading data from the memory cell array 10 and data from the memory cell array 20.

In the case where, while the data is continuously read from the memory cells connected to one word line in the memory cell array 10, data from a memory cell connected to another word line in the memory cell array 10 is read, the synchronous DRAM 600 operates in the following manner. In the following example, the burst length is 4 and the CAS latency is 2. Bit lines in the memory cell array 10 are precharged before time t0.

Figure 7:
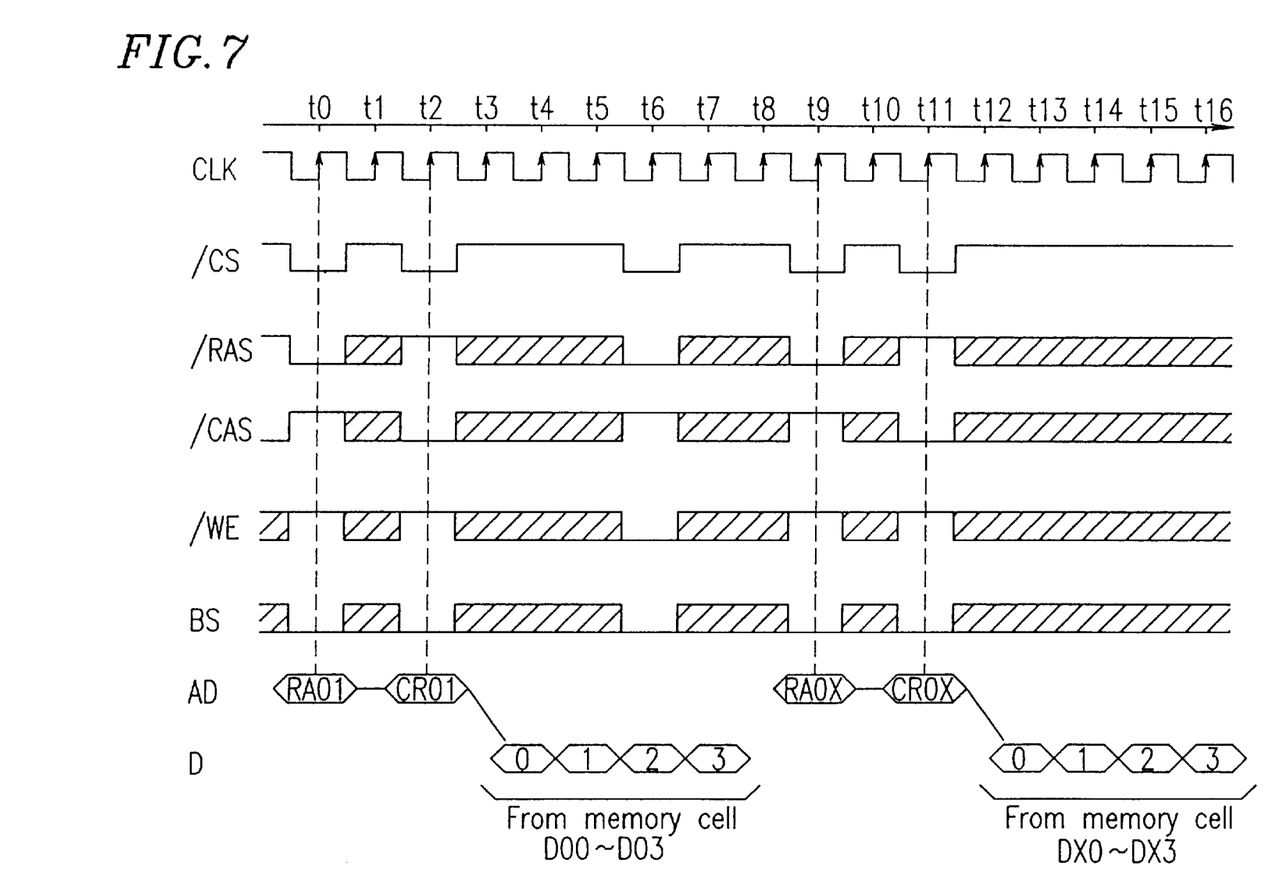
FIG. 7 is a timing diagram illustrating data output from the synchronous DRAM shown in FIG. 6 in accordance with the JEDEC standards by the function of time.

FIG. 7 is a timing diagram illustrating the data output from the synchronous DRAM 600 shown in FIG. 6 in accordance with the JEDEC standards by a function of time. The components of the synchronous DRAM 600 described below are generally shown in FIG. 6.

In this specification, "(t0)" refers to a time period from time t0 to time t1; "(t1)" refers to a time period from time t1 to time t2; "(t2)" refers to a time period from time t2 to time t3; and the like.

During time periods (t0) and (t1), the control circuit 31 instructs a row address RA01, which is a part of an address AD, to be held in the row buffer 11. The row address RA01 is decoded by the row decoder 12. As a result, one of the word lines in the memory cell array 10 is selected, and the contents stored in memory cells corresponding to one row are read to a bit line. Next, the data indicating the potential of the bit line is amplified by the sensing amplifier 13.

During time periods (t2) and (t3), the control circuit 31 instructs a column address CA01, which is a part of the address AD, to be held in the column buffer 15. The column address CA01 is decoded by the column decoder 16. As a result, data D00 indicating a potential of a bit line selected by the column decoder 16 is supplied to the input/output circuit 30 through the column switching circuit 14. The data D00 is held in a latch circuit (not shown) in the input/output circuit 30.

During a time period (t4), the data D00 is output from the latch circuit in the input/output circuit 30. In other words, at time t4, the data D00 output from the synchronous DRAM 600 can be read by an external device. The control circuit 31 supplies the column address counter in the column buffer 15 with a clock, thereby incrementing the column address in the column buffer 15. Data D01 indicating a potential of a bit line corresponding to the incremented column address is supplied to the input/output circuit 30 through the column switching circuit 14. The data D01 is held in the latch circuit in the input/output circuit 30.

An operation similar to the operation performed in the time period (t4) is repeated, and thus data D02 and data D03 are output from the input/output circuit 30 during time periods (t5) through (t7). In other words, during the time periods (t4) through (t7), continuous 4-word data D00 through D03 is output from the input/output circuit 30.

During a time period (t6), bit lines in the memory cell array 10 are precharged in preparation of the next access. According to the JEDEC standards, the contents in the row buffer 11, the column buffer 15 and in the latch circuits in the input/output circuit 30 are all cleared during the precharging. However, since one cycle of the clock CLK is as short as, for example, 10 ns, even when the synchronous DRAM 600 receives an external signal indicating the clearing at time t6, there is a delay generated from the receipt of the external signal until the execution of the clearing. Accordingly, data D03 is accurately output at time t7. The clearing is completed during a time period (t8).

During time periods (t9) and (t10), a row address RA0X and a column address CA0X are input. During time periods (t13) through (t16), continuous 4-word data DX0 through DX3 is output from the input/output circuit 30.

As can be appreciated, in a general synchronous DRAM, time periods (t8) through (t12) are wasted.

SUMMARY OF THE INVENTION

According to one aspect of the invention, a synchronous semiconductor memory device includes at least two memory cells included in a first bank; at least two word lines ; and a first sensing amplifier and a second sensing amplifier. The first sensing amplifier amplifies and holds data of one of the memory cells connected to one of the word lines. The second sensing amplifier amplifies and holds data of one other memory cell connected to one other word line.

The synchronous semiconductor memory device may be synchronized with a clock.

The synchronous semiconductor memory device may further include a first switch for electrically connecting and disconnecting the memory cell connected to the one word line and the first sensing amplifier; and a second switch for electrically connecting and disconnecting the memory cell connected to the one other word line and the second sensing amplifier.

The synchronous semiconductor memory device may further include at least two memory cells included in a second bank. The first bank and the second bank share the second sensing amplifier.

The synchronous semiconductor memory device may further include a column address counter for counting an address in synchronization with a falling edge of a column address strobe signal/CAS; and a column decoder for selecting a column in the first bank in accordance with an output signal from the column address counter.

The synchronous semiconductor memory device may further include a column address counter for counting an address in synchronization with the clock; and a column decoder for selecting a column in the first bank in accordance with an output signal from the column address counter.

The synchronous semiconductor memory device may further include a third switch for connecting and disconnecting the first sensing amplifier and a first data bus; a fourth switch for connecting and disconnecting the second sensing amplifier and a second data bus; and an input/output circuit, connected to the first data bus and the second data bus, for outputting the data.

The at least two memory cells may be connected to a first bit line and a second bit line. The first bit line and the second bit line may be connected to a first sense line and a second sense line through the first switch. The first bit line and the second bit line may be connected to a third sense line and a fourth sense line through the second switch.

When one word line is selected in accordance with a first active command synchronized with a clock, the first switch may electrically connect a memory cell connected to the word line and the first sensing amplifier to each other, and the second switch may electrically disconnect a memory cell connected to one other word line and the second sensing amplifier to each other.

After one word line is selected before the read command is input in synchronization with the clock, the first sensing amplifier connected to the first and second sense lines through the first switch may be activated, thereby causing the first sensing amplifier to amplify a potential difference between the first and second sense lines and to latch data indicating the amplified potential difference.

While the first sensing amplifier latches the data in accordance with an input of the read command synchronized with the clock, the first switch may be disconnected, thereby causing the data in the first sensing amplifier to be transferred to the first data bus through the third switch in synchronization with the clock.

While the first sensing amplifier latches the data after the read command is input in synchronization with the clock, the one word line may be made unselected in order to rewrite the data into the memory cell.

While the first or second sensing amplifier latches the data after the read command is input in synchronization with the clock, the first and second switches may be made unselected, and the first and second bit lines may be precharged.

After the read command is input in synchronization with the clock, the first or second data bus from which the data is read may be released from the precharged state, and the data bus from which the data is not read may be precharged.

Before a second active command is input, the first switch may electrically disconnect the first and second bit lines from the first and second sense lines, the second switch may electrically connect the first and second bit lines and the third and fourth sense lines, and the precharge circuit may precharge the first and second bit lines and the third and fourth sense lines.

In accordance with an input of the second active command in synchronization with the clock, the second sensing amplifier connected to the third and fourth sense lines through the second switch may be activated, thereby causing the second sensing amplifier to amplify a potential difference between the third and fourth sense lines and to latch data indicating the amplified potential difference.

The first or second active command may be determined based on the chip select signal/CS, the row address strobe signal/RAS, the column address strobe signal/CAS, the write enable signal/WE and the bank select signal BS in synchronization with a rising edge of the clock CLK supplied from an external device.

The read command may be determined based on the chip select signal/CS, the row address strobe signal/RAS, the column address strobe signal/CAS, the write enable signal/WE, the bank select signal BS and the address signal AD in synchronization with a rising edge of the clock CLK supplied from an external device.

According to another aspect of the invention, a method for controlling a synchronous semiconductor memory device including a plurality of memory cells included in one bank and arranged in a matrix, first and second amplifiers, first through fourth switches, first and second word lines, first and second bit lines, first through fourth sense lines, and first and second data buses, includes the steps of: putting the first switch into a conducting state and putting the second switch into a non-conducting state when the first word line is selected after a first active command is input; activating only the first sensing amplifier connected to the first and second sense lines which are connected to the first and second bit lines through the first switch in a conducting state after the first word line is selected, thereby causing the first sensing amplifier to amplify a potential difference between the first and second sense lines and to latch data indicating the amplified potential difference; deselecting the first word line to rewrite the data into a memory cell while the first sensing amplifier latches the data after a read command is input; putting the first and second switches into a non-conducting state to precharge the first and second bit lines separated from the first and second sensing amplifiers; reading the data from the first sensing amplifier to the first data bus through the third switch; putting the second switch to a conducting state while the data is being read to the first data bus, to precharge the first and second bit lines and the third and fourth sense lines connected to the first and second bit lines; putting the first switch into a non-conducting state and putting the second switch into a conducting state when the second word line is selected after a second active command is input; activating only the second sensing amplifier connected to the third and fourth sense lines which are connected to the second switch, thereby causing the second sensing amplifier to amplify a potential difference between the third and fourth sense lines and to latch data indicating the amplified potential difference; deselecting the second word line to rewrite the data into a memory cell while the second sensing amplifier latches the data after a read command is input; putting the first and second switches into a non-conducting state, to precharge the first and second bit lines separated from the first and second sensing amplifiers; reading the data from the second sensing amplifier to the second data bus through the fourth switch; and putting the first switch into a conducting state while the data is being read to the second data bus, to precharge the first and second bit lines and the first and second sense lines connected to the first and second bit lines.

The synchronous semiconductor memory device may be synchronized with a clock.

Preferably, a semiconductor memory device may be a SDRAM.

According to still another aspect of the invention, a semiconductor memory device includes at least two memory cells included in a first bank; at least two word lines; and a first sensing amplifier and a second sensing amplifier. The first sensing amplifier amplifies and holds data of one of the memory cells connected to one of the word lines. The second sensing amplifier amplifies and holds data of one other memory cell connected to one other word line.

The semiconductor memory device may be synchronized with a clock.

The semiconductor memory device may further include a first switch for electrically connecting and disconnecting the memory cell connected to the one word line and the first sensing amplifier; and a second switch for electrically connecting and disconnecting the memory cell connected to the one other word line and the second sensing amplifier.

The semiconductor memory device may further include at least two memory cells included in a second bank, wherein the first bank and the second bank share the second sensing amplifier.

The semiconductor memory device may include a column address counter for counting an address in synchronization with a falling edge of the column address strobe signal/CAS, and a column decoder for selecting a column in the first bank in accordance with an output signal from the column address counter.

The semiconductor memory device may further include a third switch for connecting and disconnecting the first sensing amplifier and a first data bus; a fourth switch for connecting and disconnecting the second sensing amplifier and a second data bus; and an input/output circuit, connected to the first data bus and the second bus, for outputting the data.

The at least two memory cells may be connected to a first bit line and a second bit line. The first bit line and the second bit line may be connected to a first sense line and a second sense line through the first switch. The first bit line and the second bit line may be connected to a third sense line and a fourth sense line through the second switch.

When one word line is selected in accordance with a first active command, the first switch may electrically connect a memory cell connected to the word line and the first sensing amplifier to each other, and the second switch may electrically disconnect a memory cell connected to one other word line and the second sensing amplifier to each other.

After one word line is selected before the read command is input, the first sensing amplifier connected to the first and second sense lines through the first switch may be activated, thereby causing the first sensing amplifier to amplify a potential difference between the first and second sense lines and to latch data indicating the amplified potential difference.

While the first sensing amplifier latches the data in accordance with an input of the read command, the first switch may be disconnected, thereby causing the data in the first sensing amplifier to be transferred to the first data bus through the third switch in synchronization with the clock.

While the first sensing amplifier latches the data after the read command is input, the one word line may be made unselected in order to rewrite the data into the memory cell.

While the first or second sensing amplifier latches the data after the read command is input, the first and second switches may be made unselected, and the first and second bit lines may be precharged.

Before a second active command is input, the first switch may electrically disconnect the first and second bit lines from the first and second sense lines, the second switch may electrically connect the first and second bit lines and the third and fourth sense lines, and the precharge circuit may precharge the first and second bit lines and the third and fourth sense lines.

In accordance with an input of the second active command, the second sensing amplifier connected to the third and fourth sense lines through the second switch may be activated, thereby causing the second sensing amplifier to amplify a potential difference between the third and fourth sense lines and to latch data indicating the amplified potential difference.

The first or second active command may be determined based on the chip select signal/CS, the row address strobe signal/RAS, the column address strobe signal/CAS, the write enable signal/WE and the bank select signal BS in synchronization with a rising edge of the clock CLK supplied from an external device.

The read command may be determined based on the chip select signal/CS, the row address strobe signal/RAS, the column address strobe signal/CAS, the write enable signal/WE, the bank select signal BS and the address signal AD in synchronization with a rising edge of the clock CLK supplied from an external device.

According to still another aspect of the invention, a method for controlling a semiconductor memory device including a plurality of memory cells included in one bank and arranged in a matrix, first and second amplifiers, first through fourth switches, first and second word lines, first and second bit lines, first through fourth sense lines, and first and second data buses include the steps of: putting the first switch into a conducting state and putting the second switch into a non-conducting state when the first word line is selected after a first active command is input; activating only the first sensing amplifier connected to the first and second sense lines which are connected to the first and second bit lines through the first switch in a conducting state after the first word line is selected, thereby causing the first sensing amplifier to amplify a potential difference between the first and second sense lines and to latch data indicating the amplified potential difference; deselecting the first word line to rewrite the data into a memory cell while the first sensing amplifier latches the data after a read command is input; putting the first and second switches into a non-conducting state to precharge the first and second bit lines separated from the first and second sensing amplifiers; reading the data from the first sensing amplifier to the first data bus through the third switch; putting the second switch to a conducting state while the data is being read to the first data bus, to precharge the first and second bit lines and the third and fourth sense lines connected to the first and second bit lines; putting the first switch into a non-conducting state and putting the second switch into a conducting state when the second word line is selected after a second active command is input; activating only the second sensing amplifier connected to the third and fourth sense lines which are connected to the second switch, thereby causing the second sensing amplifier to amplify a potential difference between the third and fourth sense lines and to latch data indicating the amplified potential difference; deselecting the second word line to rewrite the data into a memory cell while the second sensing amplifier latches the data after a read command is input; putting the first and second switches into a non-conducting state, to precharge the first and second bit lines separated from the first and second sensing amplifiers; reading the data from the second sensing amplifier to the second data bus through the fourth switch; and putting the first switch into a conducting state while the data is being read to the second data bus, to precharge the first and second bit lines and the first and second sense lines connected to the first and second bit lines.

The semiconductor memory device may be synchronized with a clock.

Preferably, a semiconductor memory device may be a SDRAM.

According to still another aspect of the invention, a synchronous semiconductor memory device includes a plurality of memory cell arrays. The plurality of memory cell arrays include a plurality of memory cells; a plurality of word lines, controlled by an output from a column address decoder, for selecting the memory cells; and a plurality of bit lines for transferring data read from the memory cells simultaneously selected by the word lines. The synchronous semiconductor memory device operates in synchronization with a clock. The synchronous semiconductor memory device further includes a plurality of first sense lines and a plurality of second sense lines respectively connected to the bit lines through a first switch and a second switch. A first sensing amplifier is connected to the first sense lines, and a second sensing amplifier is connected to the second sense lines. The sense lines and the sensing amplifiers are shared by adjacent memory cell arrays through the first or second switch. The sense lines are connected to a common data line through a third switch which is controlled by a column select signal which is output from a corresponding column decoder. The synchronous semiconductor memory device further includes a control circuit. For accessing data in a first row in the memory cell array, the control circuit activates the first word line and latches data in one of the first and second sensing amplifiers. For accessing data in a second row, the control circuit activates the second word line and latches the data in the other of the first and second sensing amplifiers. The first through third switches are controlled by the control circuit to output the data latched in the first or second sensing amplifier to an external device through a common data line.

The first switch may connect or disconnect the bit lines of each memory cell array and the first sense lines, the second switch may connect or disconnect the bit lines of each memory cell array and the second sense lines, and the third switch may connect or disconnect the first or second sense lines and the common data line.

An input terminal may include a column address counter connected to an address bus, the column address counter may count the address which is input through the address bus in synchronization with the clock, and the output from the column address counter may be input to a corresponding column decoder.

A synchronous semiconductor memory device may include an input/output circuit connected to a plurality of common data lines, and the data may be output to an external device through the input/output circuit.

When the first word line is selected in response to an input of a first active command in synchronization with the clock, one of the first and second switches may be in a conducting state and the other switch may be in a non-conducting state.

After the first word line is selected until a read command is input in synchronization with the clock, the sensing amplifier connected to the sense lines which are connected to the bit lines through the first or second switch which is in a conducting state may be activated, thereby causing the sensing amplifier to amplify a potential difference between the sense line pair and between the bit line pair and to latch the data.

While the first or second sensing amplifier latches the data in response to an input of a read command synchronized with the clock, the first or second switch which is in a conducting state may be put into a non-conducting state, and data in the sense lines separated from the bit lines may be sequentially read to a common data line in synchronization with the clock through the third switch which is controlled by the column select signal updated in synchronization with the clock.

While the first or second sensing amplifier latches the data after a read command is input in synchronization with the clock, the word line may be made unselected and the data may be rewritten into the memory cell.

While the first or second sensing amplifier latches the data after a read command is input in synchronization with the clock, the first or second switch may be put into a non-conducting state, and the bit lines may be precharged.

After a read command is input in synchronization with the clock, the common data line from which data is sequentially read may be released from the precharged state, and the common data line from which the data is not read may be precharged.

Before a second active command is input, the first or second switch which is in a conducting state when the first word line is selected may be put into a non-conducting state, and the switch which is in a non-conducting state when the first word line is selected may be put into a conducting state, thereby activating the precharge circuit connected to the bit lines. Thus, the bit lines and the sense lines which are connected thereto may be automatically precharged.

In response to the second active command in synchronization with the clock, the sense line connected to the first or second switch which is in a conducting state may be amplified and the data may be latched by that sensing amplifier.

According to still another aspect of the invention, a method for controlling a synchronous semiconductor memory device may include the steps of: putting a first switch into a conducting state and putting a second switch into a non-conducting state when a first word line is selected after a first active command is input; activating the first sensing amplifier connected to the sense lines which are connected to the bit lines through the first switch in a conducting state after the first word line is selected, thereby causing the first sensing amplifier to amplify a potential difference between the sense line pair and the bit line pair and to latch data; making the first word line unselected to rewrite the data into a memory cell while the first sensing amplifier latches the data after a read command is input; putting the first and second switches into a non-conducting state to precharge the bit lines separated from the first and second sensing amplifiers; reading the data from the sensing amplifiers to a common data line through a third switch controlled by a column select signal; putting the second switch into a conducting state in the same time period to activate the precharge circuit connected to the bit lines, thereby automatically precharging the bit lines and the sense lines connected thereto; putting the first switch into a non-conducting state and putting the second switch into a conducting state when a second word line is selected after a second active command is input; amplifying the sense lines, connected by the switch in a conducting state, by the sensing amplifier and latching data by that sensing amplifier; making the second word line unselected while the data is latched by the sensing amplifier after the read command is input to rewrite the data to a memory cell; putting the first and second switches into a non-conducting state to precharge the bit lines separated from the first and second sensing amplifiers; reading the data from the sensing amplifier to the common data line through the third switch controlled by the column select signal; and putting the first switch into a conducting state during the same time period to activate the precharge circuit connected to the bit lines, thereby automatically pre-charging the bit lines and the sense lines connected thereto.

The active command may be input to the control circuit as a combination of the chip select signal/CS, the row address strobe signal/RAS, the column address strobe signal/CAS, the write enable signal/WE and the bank select signal BS in synchronization with a rising edge of the clock CLK supplied from an external device.

The read command may be input to the control circuit as a combination of the chip select signal/CS, the row address strobe signal/RAS, the column address strobe signal/CAS, the write enable signal/WE, the bank select signal BS and the address signal AD in synchronization with a rising edge of the clock CLK supplied from an external device.

Preferably, a semiconductor memory device may be a SDRAM.

According to still another aspect of the invention, a dynamic semiconductor memory device includes a plurality of memory cell arrays. The plurality of memory cell arrays include a plurality of memory cells; a plurality of word lines, controlled by an output from a column address decoder, for selecting the memory cells; and a plurality of bit lines for transferring data read from the memory cells simultaneously selected by the word lines. The dynamic semiconductor memory device further includes a plurality of first sense lines and a plurality of second sense lines respectively connected to the bit lines through a first switch and a second switch. A first sensing amplifier is connected to the first sense lines, and a second sensing amplifier is connected to the second sense lines. The sense lines and the sensing amplifiers are shared by adjacent memory cell arrays through the first or second switch. The sense lines are connected to a common data line through a third switch which is controlled by a column select signal which is output from a corresponding column decoder. The dynamic semiconductor memory device further includes a control circuit. For accessing data in a first row in the memory cell array, the control circuit activates the first word line and latches data in one of the first and second sensing amplifiers. For accessing data in a second row, the control circuit activates the second word line and latches the data in the other of the first and second sensing amplifiers. The first through third switches are controlled by the control circuit to output the data latched in the first or second sensing amplifier to an external device through a common data line.

The first switch may connect or disconnect the bit lines of each memory cell array and the first sense lines, the second switch may connect or disconnect the bit lines of each memory cell array and the second sense lines, and the third switch may connect or disconnect the first or second sense lines and the common data line.

An input terminal may include a column address counter connected to an address bus, the column address counter may count the address which is input through the address bus in response to a falling edge of the column address strobe signal/CAS, and the output from the column address counter may be input to a corresponding column decoder.

A synchronous semiconductor memory device may include an input/output circuit connected to a plurality of common data lines, and the data may be output to an external device through the input/output circuit.

When the first word line is selected in response to an input of a first active command, one of the first and second switches may be in a conducting state and the other switch may be in a non-conducting state.

After the first word line is selected until a read command is input, the sensing amplifier connected to the sense lines which are connected to the bit lines through the first or second switch which is in a conducting state may be activated, thereby causing the sensing amplifier to amplify a potential difference between the sense line pair and between the bit line pair and to latch the data.

While the first or second sensing amplifier latches the data in response to an input of a read command, the first or second switch which is in a conducting state may be put into a non-conducting state, and data in the sense lines separated from the bit lines may be sequentially read to a common data line in synchronization with the clock through the third switch which is controlled by the column select signal updated in synchronization with a falling edge of the column address strobe signal/CAS.

While the first or second sensing amplifier latches the data after a read command is input, the word line may be made unselected and the data may be rewritten into the memory cell.

While the first or second sensing amplifier latches the data after a read command is input, the first or second switch may be put into a non-conducting state, and the bit lines may be precharged.

Before a second active command is input, the first or second switch which is in a conducting state when the first word line is selected may be put into a non-conducting state, and the switch which is in a non-conductive state when the first word line is selected may be put into a conducting state, thereby activating the precharge circuit connected to the bit lines. Thus, the bit lines and the sense lines which are connected thereto may be automatically precharged.

In response to the second active command in synchronization with the clock, the sense line connected to the first or second switch which is in a conducting state may be amplified and the data may be latched by that sensing amplifier.

According to still another aspect of the invention, a method for controlling a semiconductor memory device may include the steps of: putting a first switch into a conducting state and putting a second switch into a non-conducting state when a first word line is selected after a first active command is input; activating the first sensing amplifier connected to the sense lines which are connected to the bit lines through the first switch in a conducting state after the first word line is selected, thereby causing the first sensing amplifier to amplify a potential difference between the sense line pair and the bit line pair and to latch data; making the first word line unselected to rewrite the data into a memory cell while the first sensing amplifier latches the data after a read command is input; putting the first and second switches into a non-conducting state to precharge the bit lines separated from the first and second sensing amplifiers; reading the data from the sensing amplifiers to a common data line through a third switch controlled by a column select signal; putting the second switch into a conducting state in the same time period to activate the precharge circuit connected to the bit lines, thereby automatically precharging the bit lines and the sense lines connected thereto; putting the first switch into a non-conducting state and putting the second switch into a conducting state when a second word line is selected after a second active command is input; amplifying the sense lines, connected by the switch in a conducting state, by the sensing amplifier and latching the data by that sensing amplifier; making the second word line unselected while the data is latched by the sensing amplifier after the read command is input to rewrite the data to a memory cell; putting the first and second switches into a non-conducting state to precharge the bit lines separated from the first and second sensing amplifiers; reading the data from the sensing amplifier to the common data line through the third switch controlled by the column select signal; and putting the first switch into a conducting state during the same time period to activate the precharge circuit connected to the bit lines, thereby automatically precharging the bit lines and the sense lines connected thereto.

The active command may be input to the control circuit as a combination of the signal levels of the row address strobe signal/RAS, the column address strobe signal/CAS, the write enable signal/WE, an output enable signal/OE and the row address signal supplied from an external device.

The read command may be input to the control circuit as a combination of the signal levels of the row address strobe signal/RAS, the column address strobe signal/CAS, the write enable signal/WE, an output enable signal/OE and the column address signal supplied from an external device.

Preferably, a semiconductor memory device may be a SDRAM.

Hereinafter, the function of a semiconductor memory device according to the present invention will be described.

A semiconductor memory device, specifically a synchronous semiconductor memory device includes a first memory cell and a second memory cell included in a first bank; a first word line and a second word line; and a first sensing amplifier and a second sensing amplifier. The first sensing amplifier amplifies and holds data of the first memory cell connected to the first word line, during which time, the second sensing amplifier is in a wait state. Then, the second sensing amplifier amplifies and holds data of the second memory cell connected to the second word line, during which time, the first sensing amplifier is in a wait state.

Since the first and second memory cells share the first and second sensing amplifiers, data stored in memory cells connected to different word lines can be read at a higher speed than in a conventional semiconductor memory device.

Thus, the invention described herein makes possible the advantages of providing a semiconductor memory device and a method for controlling the same for reducing the wasted time period even in the case where, while data from memory cells connected to one word line is continuously read, data from a memory cell connected to another word line is read.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

(EXAMPLE 1)

Figure 1:
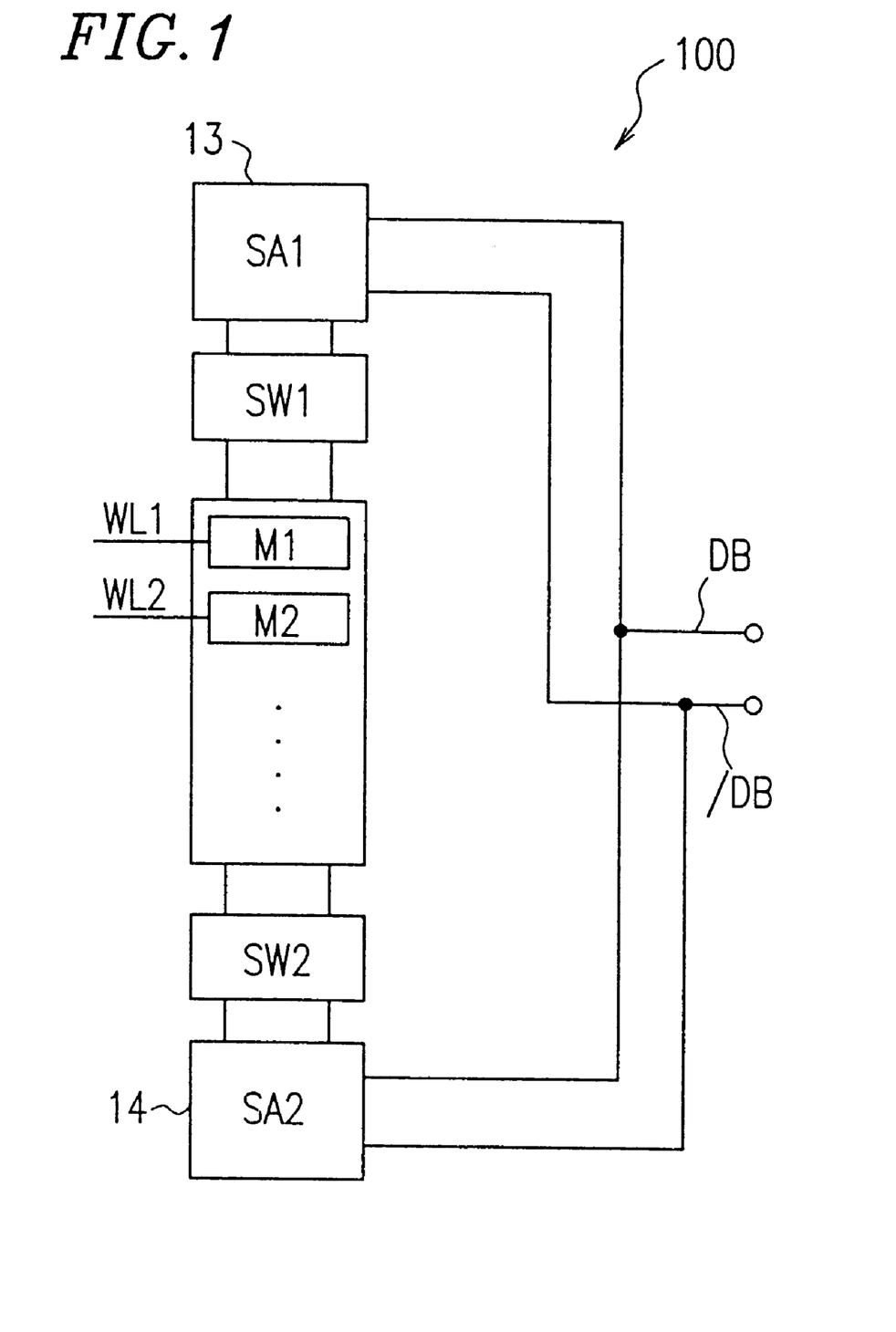
FIG. 1 schematic block diagram of a synchronous DRAM in a first example according to the present invention.

A synchronous DRAM is an exemplary synchronous semiconductor memory device. A synchronous DRAM 100 in a first example according to the present invention will be described. FIG. 1 is a schematic block diagram of the synchronous DRAM 100.

As shown in FIG. 1, the synchronous DRAM 100 includes sensing amplifiers SA1 and SA2, switches SW1 and SW2, memory cells M1 and M2, word lines WL1 and WL2, and data buses DB and /DB.

The synchronous DRAM 100 operates, for example, in the following manner.

A signal for activating the memory cell M1 is sent to the word line WL1. Then, the switch SW1 is turned on, and the data stored in the memory cell M1 is sent to the sensing amplifier SA1 and amplified. The switch SW2 is maintained in an off state from the time when the signal for activating the memory cell M1 is sent to the word line WL1 until the amplification of the data from the memory cell Ml by the sensing amplifier SA1 is completed.

Next, a signal for activating the memory cell M2 is sent to the word line WL2. The switch SW2 is turned on, and the data stored in the memory cell M2 is sent to the sensing amplifier SA2 and amplified. While the data from the memory cell M2 is amplified by the sensing amplifier SA2, the amplified data from the memory cell M1 is output from the data buses DB and /DB. The switch SW1 is maintained in an off state from the time when the signal for activating the memory cell M2 is sent to the word line WL2 until the amplification of the data from the memory cell M2 by the sensing amplifier SA2 is completed.

Then, the amplified data from the memory cell M2 is output from the data buses DB and /DB.

Since the memory cells M1 and M2 share the sensing amplifiers SA1 and SA2, the synchronous DRAM 100 reads the data stored in the memory cells at a higher speed than the above-described conventional synchronous DRAM.

In the first example, the data stored in the memory cell M1 is amplified by the sensing amplifier SA1. Alternatively, the data stored in the memory cell M1 can be amplified by the sensing amplifier SA2. The data stored in the memory cell M2 can be amplified by the sensing amplifier SA1.

(EXAMPLE 2)

Figure 2:
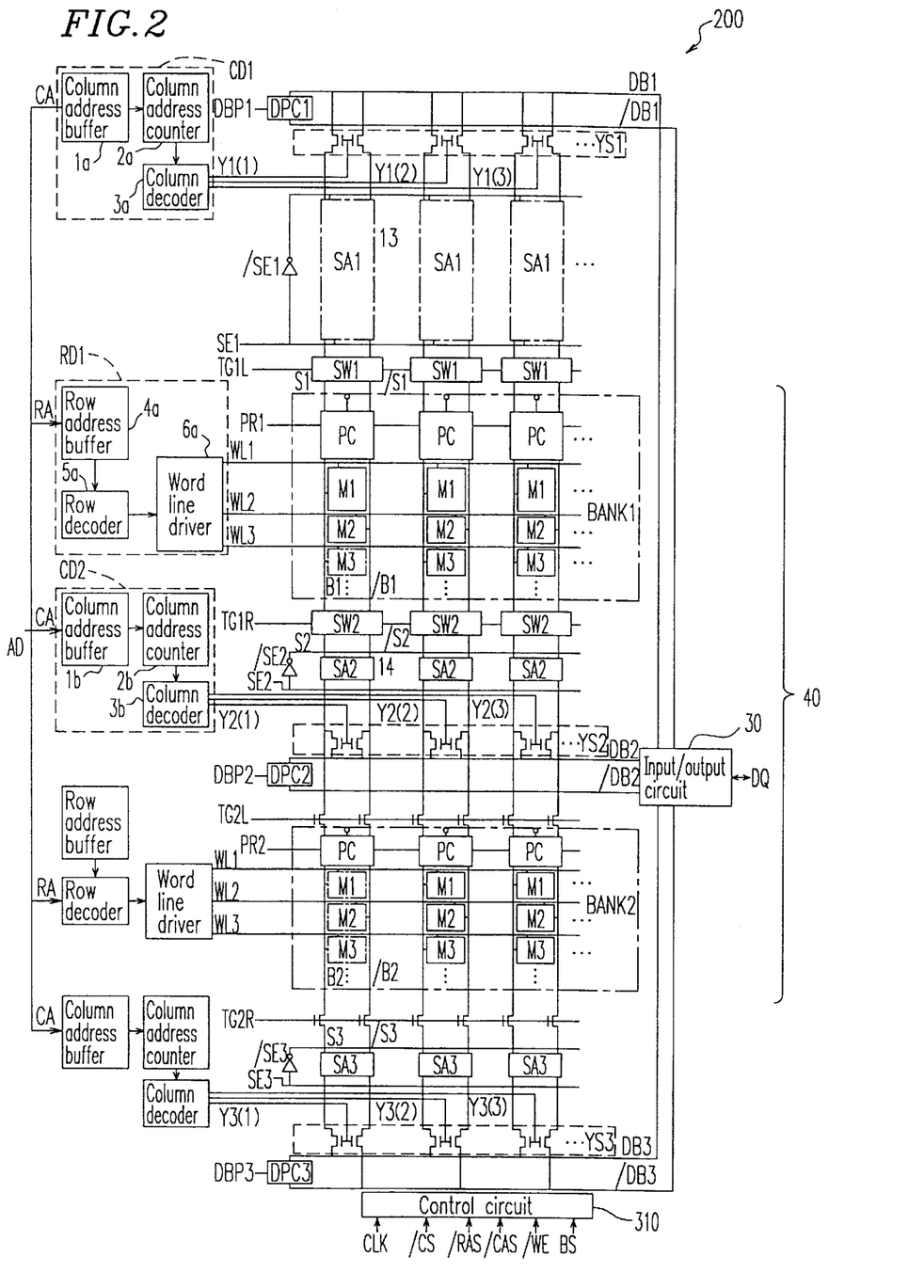
FIG. 2 is a block diagram of a synchronous DRAM in a second example according to the present invention.

A synchronous DRAM 200 in a second example according to the present invention will be described. FIG. 2 is a block diagram of the synchronous DRAM 200.

As shown in FIG. 2, the synchronous DRAM 200 includes sensing amplifiers SA1 and SA2, switches SW1 and SW2, a column switch circuit YS1, a memory array 40 including memory cells M1, M2 and M3, word lines WL1, WL2 and WL3, data buses DB1, /DB1, DB2 and /DB2, and column drivers CD1 and CD2. The column driver CD1 includes a column address buffer 1a, a column address counter 2*a*, and a column decoder 3*a*. The column address driver CD2 includes a column address buffer 1*b*, a column address counter 2*b*, and a column decoder 3*b*. The memory array is divided into a plurality of banks BANK1 and BANK2. The banks, BANK1 and BANK2, have an identical structure with respect to each other.

The synchronous DRAM 200 further includes a row driver RD1. The row driver RD1 includes a row address buffer 4*a*, a row decoder 5*a*, and a word line driver 6*a*. The synchronous DRAM 200 further includes a precharge circuit PC, a column switch circuit YS2, a data precharge circuits DPC1 and DPC2.

An address AD includes row addresses RA and column addresses CA. A row address RA is held in the row address buffer 4*a*. The row address RA held in the row address buffer 4*a* is decoded by the row decoder 5*a*. Based on the decoding results, the word line driver 6*a* selects one word line.

Column addresses CA are held in the column address buffers 1*a* and 1*b*. The column addresses CA held in the column address buffers 1*a* and 1*b* are input to the column address counters 2*a* and 2*b*. The column address counters 2*a* and 2*b* count up each clock and output the results. Based on the results output from the column address counters 2*a* and 2*b*, the column decoders 3*a* and 3*b* perform decoding and output the resultant column selection signals Y1 and Y2.

A control circuit 310 controls, for example, the column drivers CD1 and CD2 and the row driver RD1, based on a clock CLK supplied from an external device, a chip select signal/CS, a row address strobe signal/RAS, a column address strobe signal/CAS, a write enable signal/WE which are supplied from an external device, and a bank selection signal BS indicating the most significant bit of the address AD.

When the chip select signal/CS is LOW, the control circuit 310 outputs a series of control signals from the rising edge of the clock CLK. The bank selection signal BS is the most significant bit of the address, and indicates selection of bank BANK1 when the most significant bit is LOW and indicates selection of bank BANK2 when the most significant bit is HIGH. When the row address strobe signal/RAS is LOW and the column address strobe signal/CAS is HIGH, the address AD is held in a row address buffer register at the rising edge of the clock CLK, and then data is read onto the bit line and amplified by the sensing amplifier SA1. When the row address strobe signal/RAS is HIGH and the column address strobe signal/CAS is LOW, the address AD is held in a column address buffer at the rising edge of the clock CLK, and then data indicating a potential of the bit line is read or written depending on whether the write enable signal/WE is HIGH or LOW.

The control circuit 310 performs control operations in accordance with the JEDEC standards. When the chip select signal/CS, the row address strobe signal/RAS and the column address strobe signal/CAS are all LOW, the control circuit 310 automatically performs precharge. Hereinafter, an exemplary operation of the synchronous DRAM 200 in the second example will be described with reference to FIGS. 2 through 5.

The control circuit 310 includes a mode register (not shown) and can set a burst length, a lap type, and a CAS latency. The control circuit 310 includes a self refresh circuit for performing self refresh to the memory array 40.

The synchronous DRAM 200 shown in FIG. 2 includes two banks, but the present invention is not limited by the number of banks. Three or more banks can be included.

In the case where three or more banks are included, the banks are connected to one of the sensing amplifiers SA through one transfer gate and connected to the other sensing amplifier through another transfer gate. In other words, two adjacent banks share one sensing amplifier. The precharge circuit, the sensing amplifiers, and the column switch circuits have the same structure as those described later.

Figure 3:
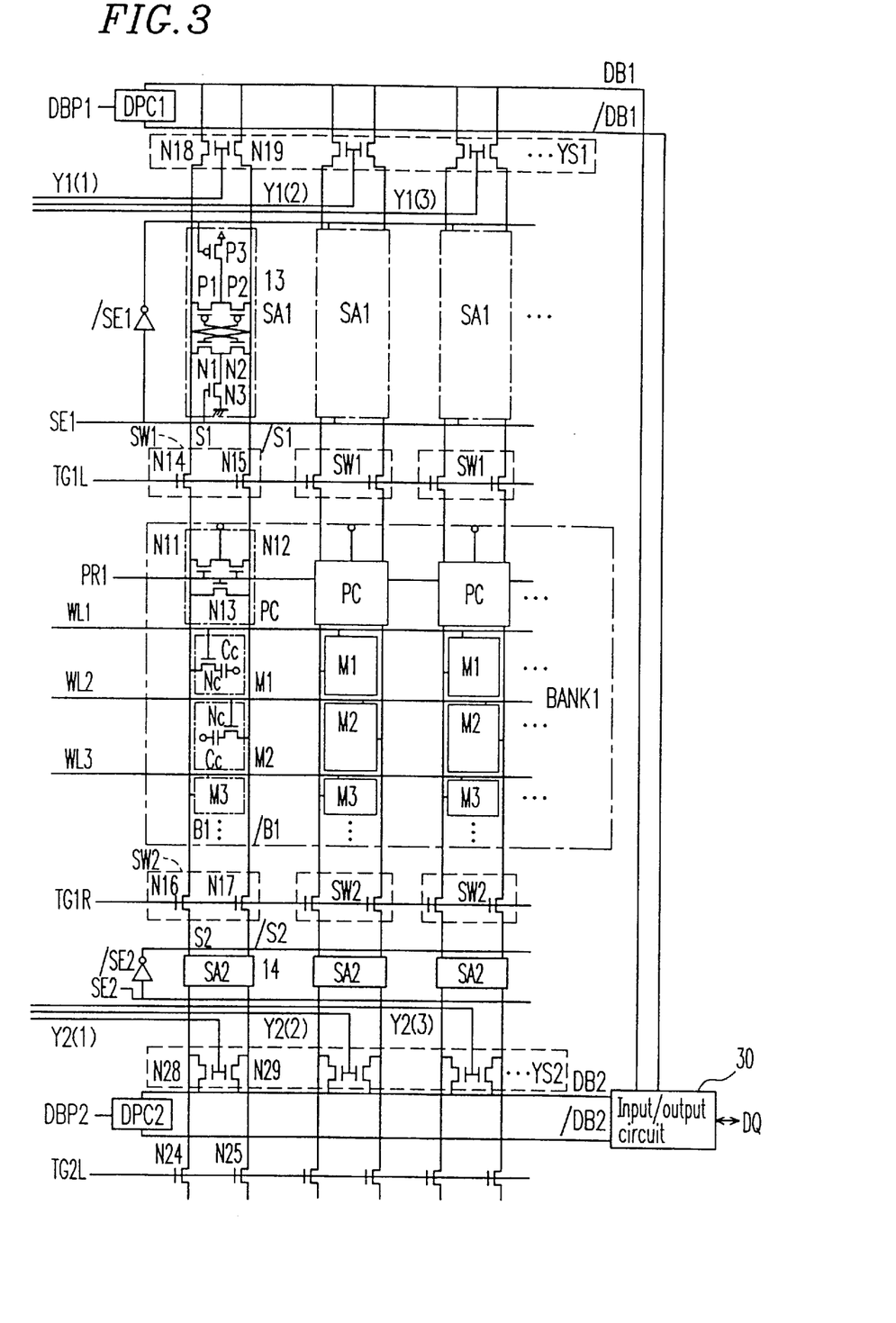
FIG. 3 is an enlarged view of a main part of the synchronous DRAM shown in FIG. 2.

FIG. 3 is an enlarged view of an important part of the synchronous DRAM 200 shown in FIG. 2.

The memory cell M1 includes a MOS capacitor Cc and an n-type MOS transistor Nc. An end of the MOS capacitor Cc is connected to ground, and the other end of the MOS capacitor Cc is connected to a bit line B1 through the n-type MOS transistor Nc. A gate of the n-type MOS transistor Nc is connected to the word line WL1.

The memory cell M2 includes a MOS capacitor Cc and an n-type MOS transistor Nc. An end of the MOS capacitor Cc is connected to ground, and the other end of the MOS capacitor Cc is connected to a bit line/B1 through the n-type MOS transistor Nc. A gate of the n-type MOS transistor Nc is connected to the word line WL2.

The switch SW1 includes n-type MOS transistors N14 and N15, each including a first electrode, a second electrode and a gate electrode. The first electrode of the n-type MOS transistor N14 is connected to a sense line S1, and the second electrode of the n-type MOS transistor N14 is connected to a bit line B1. When the gate electrode of the n-type MOS transistor N14 receives a HIGH transfer gate signal TG1L, the n-type MOS transistor N14 electrically connects the sense line S1 and the bit line B1 to each other.

The first electrode of the n-type MOS transistor N15 is connected to a sense line/S1, and the second electrode of the n-type MOS transistor N15 is connected to a bit line/B1. When the gate electrode of the n-type MOS transistor N15 receives a HIGH transfer gate signal TG1L, the n-type MOS transistor N15 electrically connects the sense line/S1 and the bit line/B1 to each other.

The switch SW2 includes n-type MOS transistors N16 and N17, each including a first electrode, a second electrode and a gate electrode. The switch SW2 has the same structure as that of the switch SW1 except that the n-type MOS transistors N16 and N17 are used in lieu of the n-type MOS transistors N14 and N15. When the gate electrode of each of the n-type MOS transistors N16 and N17 receives a HIGH transfer gate signal TG1R, the n-type MOS transistors N16 and N17 each electrically connect the sense line S2, /S2 and the bit line B1, /B1 to each other.

The precharge circuit PC includes n-type MOS transistors N11, N12 and N13, each including a first electrode, a second electrode and a gate electrode. The first electrode of each of the n-type MOS transistors N11 and N12 is connected to a power supply line having a potential of Vcc/2. The second electrode of the n-type MOS transistor N11 is connected to the bit line B1, and the second electrode of the n-type MOS transistor N12 is connected to the bit line/B1. The first and second electrodes of the n-type MOS transistor N13 are connected to the bit lines B1 and /B1, respectively. The n-type MOS transistor N13 acts as an equalizer.

The gate electrode of each of the n-type MOS transistors N11 and N12 receives a precharge signal PR1. When the precharge signal PR1 is HIGH, the precharge circuit PC precharges at least the bit lines B1 and /B1 to have a potential of Vcc/2.

The sensing amplifier SA1 includes n-type MOS transistors N1 through N3 and p-type MOS transistors P1 through P3. The sensing amplifier SA1 is connected to the sense lines S1 and /S1.

Connected to a gate of each of the n-type MOS transistor N3 is a sensing amplifier driving signal SE1, and connected to the p-type MOS transistor P3 is a sensing amplifier driving inverse signal/SE1. When the sensing amplifier driving signal SE1 is HIGH, the sensing amplifier SA1 amplifies the potential difference between the bit lines B1 and /B1 which are respectively in electric connection with the sensing lines S1 and /S1. The potential difference between the bit lines B1 and /B1 is made an extreme value of a power supply potential Vcc or a ground potential GND by the sensing amplifier SA1.

The sensing amplifier SA2 has the same structure as that of the sensing amplifier SA1 except for receiving a sensing amplifier driving signal SE2 and a sensing amplifier driving inverse signal/SE2, in lieu of the sensing amplifier driving signal SE1 and the sensing amplifier driving inverse signal/SE1.

The column switch circuit YS1 includes n-type MOS transistors N18 and N19, each including a first electrode, a second electrode and a gate electrode. The first electrode of the n-type MOS transistor N18 is connected to a data bus DB1, and the first electrode of the n-type MOS transistor N19 is connected to a data bus/DB1. The second electrode of the n-type MOS transistor N18 is connected to the sense line S1, and the second electrode of the n-type MOS transistor N19 is connected to the sense line /S1. Input to gates of the n-type MOS transistors N18 and N19 is a column selection signal Y1.

The column switch circuit YS2 includes n-type MOS transistors N28 and N29, each including a first electrode, a second electrode and a gate electrode. The column switch circuit YS2 has the same structure as that of the column switch circuit YS1 except that the n-type MOS transistors N28 and N29 are used in lieu of the n-type MOS transistors N18 and N19.

A data line precharge circuit DPC1 is connected between the data bus DB1 and the data bus/DB1. A data line precharge signal DBP1 is input to the data line precharge circuit DPC1. When the data line precharge signal DBP1 is input, the data buses DB1 and /DB1 are precharged.

A data line precharge circuit DPC2 is connected between the data bus DB2 and the data bus/DB2. A data line precharge signal DBP2 is input to the data line precharge circuit DPC2. When the data line precharge signal DBP2 is input, the data buses DB2 and /DB2 are precharged.

The data buses DB1, /DB1, DB2 and /DB2 are connected to an input/output circuit 30. The input/output circuit 30 includes a data bus multiplexer, a sensing amplifier for amplifying the potential difference between the data buses DB1 and /DB1 and between the data buses DB2 and /DB2, and a flip-flop circuit for holding the data on the data buses DB1, /DB1, DB2 and /DB2.

Figure 4:
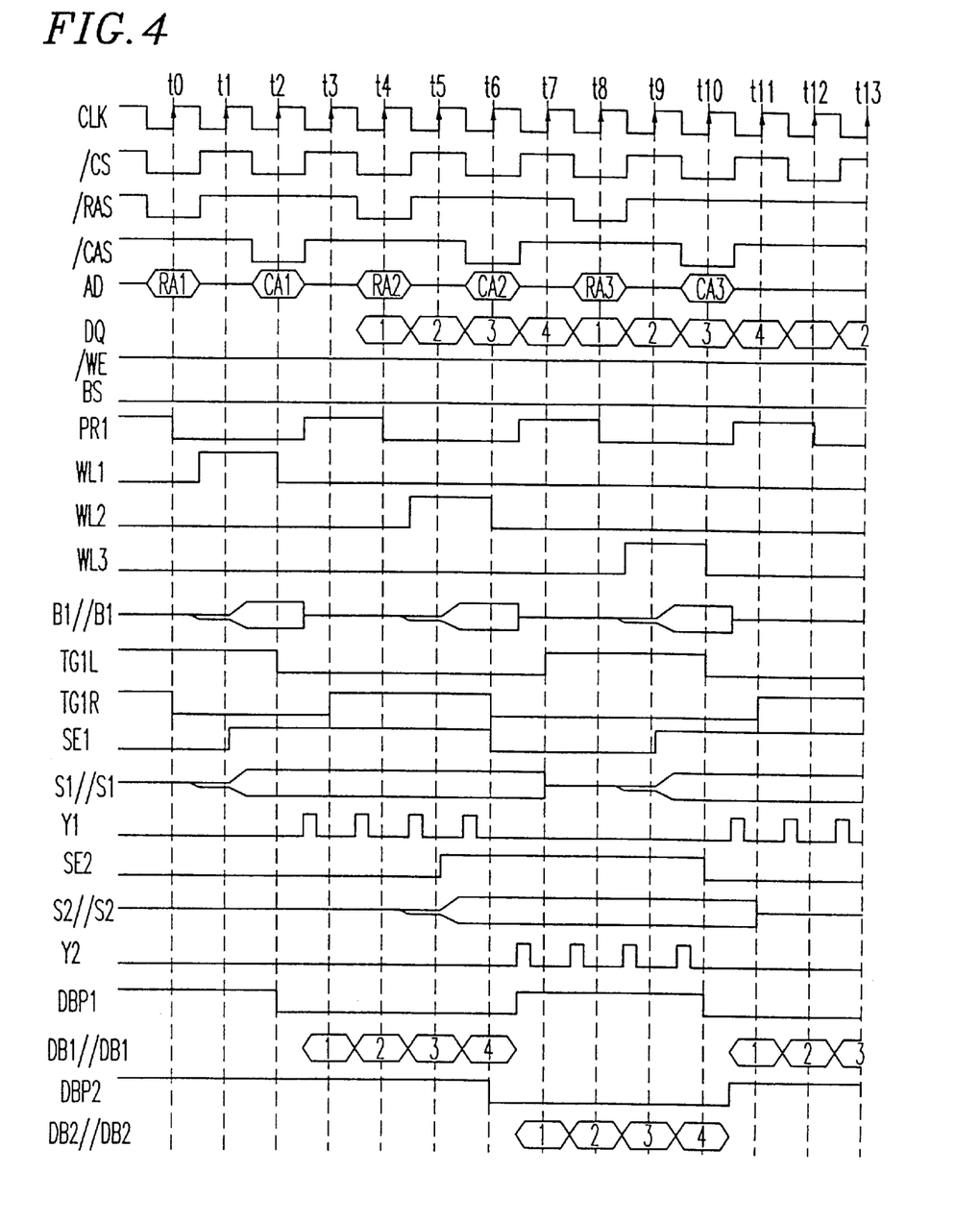
FIG. 4 is a timing diagram illustrating an illustrative operation of the synchronous DRAM shown in FIG. 2.

FIG. 4 is a timing diagram illustrating an exemplary operation of the synchronous DRAM 200 shown in FIGS. 2 and 3. In the illustrated example, the burst length is 4 and the CAS latency is 2.

An operation of the synchronous DRAM 200 in the case where data is read from a first row of the bank BANK1 and successively data is read from a second row of the bank BANK1 will be described. In this case, since the bank BANK2 is not involved in the operation, the bit lines B2 and /B2 and the sense lines S3 and /S3 are kept in the precharged state. Signals associated with the bit lines, for example, the word line WL2 and the like are all inactive.

As described above, in this specification, "(t0)" refers to a time period from time t0 to time t1; "(t1)" refers to a time period from time t1 to time t2; "(t2)" refers to a time period from time t2 to time t3; and the like.

Before time t0, the precharge signal PR1 and the transfer gate signals TG1L and TG1R are at HIGH level, and the bit lines B1 and /B1 and the sense lines S1, /S1, S2 and /S2 are all precharged to have a potential of Vcc/2. The HIGH level of the transfer gate signals TG1L and TG1R refers to a boost level raised from the power supply voltage Vcc.

In a time period (t0), the chip select signal/CS is LOW, the row address strobe signal/RAS is LOW, the column address strobe signal/CAS is HIGH, the bank selection signal BS1 (not shown) is HIGH, and the bank selection signal BS2 (not shown) is LOW. Accordingly, the bank BANK1 is activated as follows.

When the precharge signal PR1 becomes LOW, and the bit lines B1 and /B1 and the sense lines S1, /S1, S2 and /S2 are released from the precharged state and put into a floating state. Since the transfer gate signal TG1R becomes LOW, the bit lines B1 and /B1 are disconnected from the sense lines S2 and /S2.

At least a row address RA1 in the address AD is held in a row address buffer register 4a. Based on the data held in the row address buffer register 4a, the row decoder 5a selects a word line, for example, the word line WL1. At this point, the level of the word line WL1 becomes HIGH. When the word line WL1 is selected, the charge accumulated in the memory cell capacitor is transferred to the bit lines B1 and /B1 and the sense lines S1 and /S1. Accordingly, a microscopic potential difference is generated between the bit lines B1 and /B1, and also between the sense lines S1 and /S1.

The HIGH level of the word line refers to a boost level raised from the power supply voltage Vcc.

In a time period (t1), the sensing amplifier driving signal SE1 becomes HIGH, and the sensing amplifiers SA1 are activated. The sensing amplifiers SA1 amplify the potentials of the sense lines S1 and /S1. The sensing amplifiers SA1 hold data indicating the amplified potentials. In other words, data corresponding to one row is held by a plurality of sensing amplifiers SA1. The data is written into the memory cells connected to the word line WL1.

In a time period (t2), the chip select signal/CS is LOW, the row address signal/RAS is HIGH, the column address strobe signal/CAS is LOW, the write enable signal/WE is HIGH, and the bank selection signal BS is LOW.

Since the burst length is 4 in the illustrated example, 4-word data (one word=one bit in this example) from the sensing amplifiers SA1 is sequentially read in the following manner.

The word line WL1 becomes LOW, and the data indicating the potentials of the bit lines B1 and /B1 is stored and held in the memory cells connected to the word line WL1. The transfer gate signal TG1L becomes LOW, and the bit lines B1 and /B1 are disconnected from the sense lines S1 and /S1. The data bus precharge signal DBP1 becomes LOW, and the data buses DB1 and /DB1 are released from the precharged state. The plurality of sensing amplifiers SA1 hold the data corresponding to a first row.

Since the CAS latency is 2 in the illustrated example, at least a column address CA1 in the address AD is latched by the column address buffer 1a. The latched address CA1 is output to the column address counter 2a. A column selection signal Y1(1) which is selected by the first column address which is output from the column address counter 2a becomes HIGH, and the data indicating the potentials of the sense lines S1 and /S1 is transferred to the data buses DB1 and /DB1. Then, the column selection signal Y1(1) is returned to LOW. Herein, signal Y1(n) refers to a signal corresponding to column (n) selected by the column decoder 3a.

Figure 5:
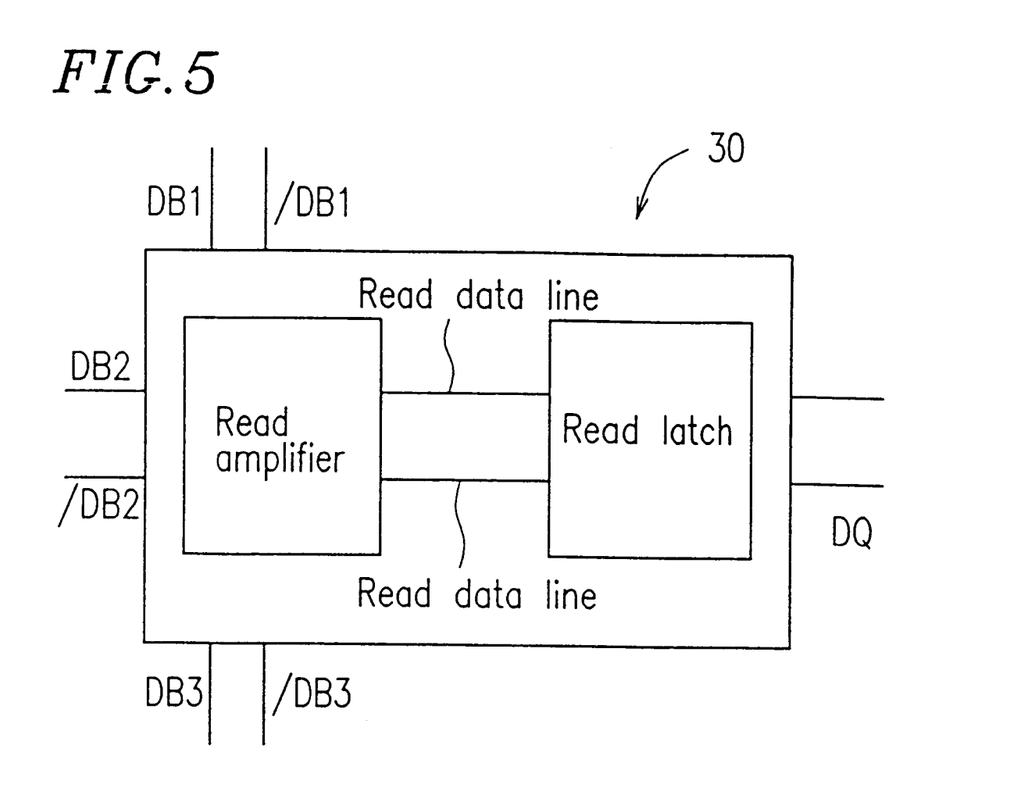
FIG. 5 is a view illustrating an arrangement of a read amplifier, a read data line, and a read latch.

Data indicating the potentials of the data buses DB1 and /DB1 is amplified by a read amplifier included in the input/output circuit 30 and then output to a read data line. The read amplifier and the read data line are shown in FIG. 5.

In preparation of a subsequent access to the memory cell in the bank BANK1, precharge is performed in the bank BANK1 as follows. The precharge signal PR1 becomes HIGH, and the bit lines B1 and /B1 in the bank BANK1 are precharged to have a potential of Vcc/2.

In a time period (t3), first data indicating a potential of the read data line is latched by a read latch and then output from a DQ output terminal. The read latch is also shown in FIG. 5.

In preparation of an input of another row address of the bank BANK1, the transfer gate signal TG1R becomes HIGH, and the sense lines S2 and /S2 are precharged. In the time period (t3), the column address counter 2a counts up the value stored therein. Based on the value obtained by the counting-up, the column decoder 3a selects a second column. At this point, a column selection signal Y1(2) becomes HIGH. When the second column is selected, second data indicating potentials of the sensing lines S2 and /S2 in the second column is transferred from the sensing amplifier SA1 in the second column to the data buses DB1 and /DB1. Then, the column selection signal Y1(2) is returned to LOW.

The second data indicating the potentials of the data buses DB1 and /DB1 is amplified by the read amplifier and then output to the read data line.

In a time period (t4), at the rising edge of the clock CLK, the row address strobe signal/RAS is LOW, and a second row address in the bank BANK1 is input. The bank BANK1 is activated as described below.

The precharge signal PR1 becomes LOW, and the bit lines B1 and /B1 and the sense lines S2 and /S2 are released from the precharged state and put into a floating state.

At least a row address RA2 in the address AD is held in a row address buffer register 4a. Based on the data held in the row address buffer register 4a, the row decoder 5a selects a word line, for example, the word line WL2. At this point, the level of the word line WL2 becomes HIGH. When the word line WL2 is selected, the charge accumulated in the memory cell capacitor is transferred to the bit lines B1 and /B1 and the sense lines S2 and /S2. Accordingly, a microscopic potential difference is generated between the bit lines B1 and /B1, and also between the sense lines S2 and /S2.

The second data indicating the potential of the read data line is latched by the read latch and then output from the DQ output terminal. In the time period (t4), the column address counter 2a counts up the value stored therein. Based on the value obtained by the counting-up, the column decoder 3a selects a third column. At this point, a column selection signal Y1(3) becomes HIGH. When the column selection signal Y1(3) becomes HIGH, second data indicating potentials of the sensing lines S1 and /S1 in the third column is transferred to the data buses DB1 and /DB1. Then, the column selection signal Y1(3) is returned to LOW.

Third data indicating the potentials of the data buses DB1 and /DB1 is amplified by the read amplifier and then output to the read data line.

In a time period (t5), the sensing amplifier driving signal SE2 becomes HIGH, and the sensing amplifier SA2 is activated. The sensing amplifiers SA2 amplify the potentials of the sense lines S2 and /S2. The sensing amplifiers SA2 hold data indicating the amplified potentials. In other words, data corresponding to one row is held by a plurality of amplifiers SA2. The data is written into the memory cells connected to the word line WL2.

The third data indicating the potential of the read data line is latched by the read latch and then output to the DQ output terminal. In the time period (t5), the column address counter 2a counts up the value stored therein. The value obtained by the counting-up is output to the column decoder 3a. Based on the value obtained by the counting-up, the column decoder 3a selects a fourth column. At this point, a column selection signal Y1(4) becomes HIGH. When the column selection signal Y1(4) becomes HIGH, data indicating potentials of the sensing lines S1 and /S1 in the fourth column is transferred to the data buses DB1 and /DB1. Then, the column selection signal Y1(4) is returned to LOW.

In a time period (t6), fourth data indicating the potential of the read data line is latched by the read latch and then output to the DQ output terminal. The chip select signal/CS is LOW, the row address strobe signal/RAS is HIGH, the column address strobe signal/CAS is LOW, and the burst length is 4. Accordingly, 4-word data is sequentially read from the sensing amplifier SA2 as described below.

The level of the word line WL2 becomes LOW, and data indicating the potentials of bit lines B1 and /B1 is stored and held in the memory cells connected to the word line WL2.

The transfer gate signal TG1R becomes LOW, and the bit lines B1 and /B1 are disconnected from the sense lines S2 and /S2. The data bus precharge signal DBP2 becomes LOW, and the data buses DB2 and /DB2 are released from the precharged state. Since the CAS latency is 2, at least a column address CA2 in the address AD is latched by the column address buffer 1b. The latched column address CA2 is output to the column address counter 2b. A column selection signal Y2(1) which is selected by the first column address which is output from the column address counter 2b becomes HIGH, and the data indicating the potentials of the sense lines S2 and /S2 is transferred to the data buses DB2 and /DB2. The column selection signal Y2(1) is returned to LOW. Herein, the signal Y2(n) refers to a signal in column (n) selected by the column decoder 3b.

The data indicating the potentials of the data buses DB2 and /DB2 is amplified by the read amplifier included in the input/output circuit 30 and then output to the read data line.

In preparation of a subsequent access to the memory cell in the bank BANK1, precharge is performed in the bank BANK1. The precharge signal PR1 becomes HIGH, and the bit lines B1 and /B1 are precharged to have a potential of Vcc/2. A sensing amplifier driving signal SE1 becomes LOW, and the sense lines S1 and /S1 are put into a floating state.

In a time period (t7), the first data indicating the potential of the read data is latched by the read latch and then output from the DQ terminal.

In preparation of an input of another row address in the bank BANK1, the transfer gate signal TG1L becomes HIGH, and the sense lines S1 and /S1 are precharged. In the time period (t7), the column address counter 2b counts up the value stored therein. Based on the value obtained by the counting-up, the column decoder 3b selects the second column. At this point, the column selection signal Y2(2) becomes HIGH. When the second column is selected, the second data indicating potentials of the sensing lines S2 and /S2 in the second column is transferred from the sensing amplifier SA2 in the second column to the data buses DB2 and /DB2. Then, the column selection signal Y2(2) is returned to LOW.

The second data indicating the potentials of the data buses DB2 and /DB2 is amplified by the read amplifier and then output to the read data line.

In a time period (t8), the row address strobe signal/RAS is LOW, and a third row in the bank BANK1 is input to the row address buffer 4*a*. The bank BANK1 is activated as described below.

The precharge signal PR1 becomes LOW, and the bit lines B1 and /B1 in the bank BANK1 and the sense lines S1 and /S1 are released from the precharged state and put into a floating state.

At least a row address RA3 in the address AD is held in a row address buffer register 4*a*. The data held in the row address buffer register 4*a* is decoded by the row decoder 5*a*. Based on the decoding results, a word line driver 6*a* selects a word line, for example, a word line WL3. At this point, the level of the word line WL3 becomes HIGH.

The charge accumulated in the memory cell capacitor is transferred to the bit lines B1 and /B1 and the sense lines S1 and /S1. Accordingly, a microscopic potential difference is generated between the bit lines B1 and /B1, and also between the sense lines S1 and /S1.

The second data indicating the potential of the read data line is latched by the read latch and then output from the DQ output terminal. In the time period (t8), the column address counter 2*b* counts up the value stored therein. Based on the value obtained by the counting-up, the column decoder 3*b* selects the third column. At this point, a column selection signal Y2(3) becomes HIGH. When the third column is selected, the third data indicating potentials of the sensing lines S2 and /S2 in the third column is transferred from the sensing amplifier SA2 in the third column to the data buses DB2 and /DB2. Then, the column selection signal Y2(3) is returned to LOW.

The third data indicating the potentials of the data buses DB2 and /DB2 is amplified by the read amplifier and then output to the read data line.

In a time period (t9), the sensing amplifier driving signal SE1 becomes HIGH, and the sensing amplifier SA1 is activated. The sensing amplifiers SA1 amplify the potentials of the sense lines S1 and /S1. The sensing amplifiers SA1 hold data indicating the amplified potentials. In other words, data corresponding to one row is held by a plurality of amplifiers SA1. The data is written into the memory cells connected to the word line WL3.

The third data indicating the potential of the read data line is latched by the read latch and then output to the DQ output terminal. In the time period (t9), the column address counter 2*b* counts up the value stored therein. The value obtained by the counting-up is output to the column decoder 3*b*. Based on the value obtained by the counting-up, the column decoder 3*b* selects the fourth column. At this point, a column selection signal Y2(4) becomes HIGH. When the column selection signal Y2(4) becomes HIGH, data indicating potentials of the sensing lines S2 and /S2 in the fourth column is transferred to the data buses DB2 and /DB2. Then, the column selection signal Y2(4) is returned to LOW. Fourth data indicating the potentials of the data buses DB2 and /DB2 is amplified by the read amplifier and then output to the read data line.

In a time period (t10), the fourth data indicating the potential of the read data line is latched by the read latch and then output to the DQ output terminal. The chip select signal/CS is LOW, the row address strobe signal/RAS is HIGH, the column address strobe signal/CAS is LOW, and the burst length is 4. Accordingly, 4-word data is sequentially read from the sensing amplifier SA2 as described below.

The level of the word line WL3 becomes LOW, and data indicating the potentials of bit lines B1 and /B1 is stored and held in the memory cells connected to the word line WL3.

The transfer gate signal TG1L becomes LOW, and the bit lines B1 and /B1 are disconnected from the sense lines S1 and /S1. The data bus precharge signal DBP1 becomes LOW, and the data buses DB1 and /DB1 are released from the precharged state. Since the CAS latency is 2, at least a column address CA3 in the address AD is latched by the column address buffer 1*a*. The latched column address CA3 is output to the column address counter 2*a*. A column selection signal Y1(1) selected by the first column address which is output from the column address counter 2*a* becomes HIGH, and the data indicating the potentials of the sense lines S1 and /S1 is transferred to the data buses DB1 and /DB1. The column selection signal Y1(1) is returned to LOW.

The data indicating the potentials of the data buses DB1 and /DB1 is amplified by the read amplifier included in the input/output circuit 30 and then output to the read data line.

In preparation of a subsequent access to the memory cell in the bank BANK1, precharge is performed in the bank BANK1. The precharge signal PR1 becomes HIGH, and the bit lines B1 and /B1 are precharged to have a potential of Vcc/2. A sensing amplifier driving signal SE2 becomes LOW, and the sense lines S2 and /S2 are put into a floating state.

In a time period (t11), the first data indicating the potential of the read data is latched by the read latch and then output from the DQ terminal.

In preparation of an input of another row address in the bank BANK1, the transfer gate signal TG1R becomes HIGH, and the sense lines S2 and /S2 are precharged. In the time period (t11), the column address counter 2*a* counts up the value stored therein. Based on the value obtained by the counting-up, the column decoder 3*a* selects the second column. At this point, the column selection signal Y1(2) becomes HIGH. When the second column is selected, the second data indicating potentials of the sensing lines S1 and /S1 in the second column is transferred from the sensing amplifier SA1 in the second column to the data buses DB1 and /DB1. Then, the column selection signal Y1(2) is returned to LOW.

The second data indicating the potentials of the data buses DB1 and /DB1 is amplified by the read amplifier and then output to the read data line.

As described above, any row data in the same bank can be sequentially read.

Also in the bank BANK2, data can be read from a different row address in substantially the same manner by making the bank selection signal BS2 HIGH and using the sensing amplifiers SA2 and SA3.

In the synchronous DRAM 200 in the second example, data in a memory cell connected to a selected word line is held in a sensing amplifier. Then, the data held in the sensing amplifier is sequentially transferred to a data bus. In the case where, while such data read is being performed, an access to a memory cell connected to a different word line in the same bank is requested, the data in the memory cell connected to the different word line is held in another sensing amplifier. Accordingly, data stored in the memory cells can be accessed to with no interruption. Thus, the synchronous DRAM 200 in the second example reduces time waste compared to the conventional synchronous DRAM.

Furthermore, the data transfer speed to a sense line is raised by putting one of the first and second switches into a conducting state when a word line is selected, and the data transfer speed to a bit line is raised by putting the other switch to a non-conducting state.

In the synchronous DRAM 200 in the second example, the voltage difference between bit lines and the voltage difference between sense lines are amplified simultaneously. Rewriting of the data to the memory cell is performed earlier. Data transfer from the sense line to the data bus is performed earlier.

While one of the sensing amplifiers holds the data, the data held in that sensing amplifier is rewritten into the memory cell. In preparation of a subsequent access, the bit line and the other amplifier are precharged. Accordingly, the transfer to the subsequent access is performed at a high speed.

In the case where the sensing amplifiers are provided between two adjacent banks, an increase in the chip size of the synchronous DRAM is reduced.

In the above examples, a synchronous DRAM as an exemplary synchronous semiconductor memory device is described. The present invention is applicable to other type of semiconductor memory devices including other types of DRAMs and SRAMs.

As described above, in one aspect of the present invention, a semiconductor memory device, specifically, a synchronous semiconductor memory device includes at least two memory cells included in a first bank; at least two word lines; and a first sensing amplifier and a second sensing amplifier. Accordingly, the first sensing amplifier amplifies and holds data of one of the memory cells connected to one of the word lines, and the second sensing amplifier amplifies and holds data of one other memory cell connected to one other word line. Since the at least two memory cells in the first bank share the first and the second sensing amplifiers, data stored in memory cells connected to the different word lines can be read at a higher speed than in the conventional synchronous semiconductor memory device.

In another aspect of the present invention, a semiconductor memory device, specifically, a synchronous semiconductor memory device includes a plurality of memory cells included in one bank and arranged in a matrix, first and second amplifiers, first through fourth switches, first and second word lines, first and second bit lines, first through fourth sense lines, and first and second data buses. A method for controlling such a semiconductor memory device includes the steps of: activating the first sensing amplifier connected to the first and second sense lines which are connected to the first and second bit lines through the first switch in a conducting state after the first word line is selected, thereby causing the first sensing amplifier to amplify a potential difference between the first and second sense lines and to latch data indicating the amplified potential difference; and activating the second sensing amplifier connected to the third and fourth sense lines which are connected to the second switch, thereby causing the second sensing amplifier to amplify a potential difference between the third and fourth sense lines and to latch data indicating the amplified potential difference.

Accordingly, data stored in memory cells connected to the different word lines can be read at a higher speed than in the conventional synchronous semiconductor memory device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   at least two memory cells included in a first bank;
   at least two word lines; and
   a first sensing amplifier and a second sensing amplifier, wherein:
      the first sensing amplifier amplifies and holds data of one of the memory cells connected to one of the word lines, and
      the second sensing amplifier amplifies and holds data of one other memory cell connected to one other word line.

2. A semiconductor memory device according to claim 1, which is synchronized with a clock.

3. A semiconductor memory device according to claim 1, further comprising:
   a first switch for electrically connecting and disconnecting the memory cell connected to the one word line and the first sensing amplifier; and
   a second switch for electrically connecting and disconnecting the memory cell connected to the one other word line and the second sensing amplifier.

4. A semiconductor memory device according to claim 1, further comprising at least two memory cells included in a second bank, wherein the first bank and the second bank share the second sensing amplifier.

5. A semiconductor memory device according to claim 1, further comprising:
   a column address counter for counting an address in synchronization with a falling edge of a column address strobe signal/CAS; and
   a column decoder for selecting a column in the first bank in accordance with an output signal from the column address counter.

6. A semiconductor memory device according to claim 2, further comprising:
   a column address counter for counting an address in synchronization with the clock; and
   a column decoder for selecting a column in the first bank in accordance with an output signal from the column address counter.

7. A semiconductor memory device according to claim 3, further comprising:
   a third switch for connecting and disconnecting the first sensing amplifier and a first data bus;
   a fourth switch for connecting and disconnecting the second sensing amplifier and a second data bus; and
   an input/output circuit, connected to the first data bus and the second data bus, for outputting the data.

8. A semiconductor memory device according to claim 7, wherein:
   the at least two memory cells are connected to a first bit line and a second bit line;
   the first bit line and the second bit line are connected to a first sense line and a second sense line through the first switch, and
   the first bit line and the second bit line are connected to a third sense line and a fourth sense line through the second switch.

9. A method for controlling a semiconductor memory device including a plurality of memory cells included in one bank and arranged in a matrix, first and second amplifiers, first through fourth switches, first and second word lines, first and second bit lines, first through fourth sense lines, and first and second data buses, the method comprising the steps of:

putting the first switch into a conducting state and putting the second switch into a non-conducting state when the first word line is selected after a first active command is input;

activating only the first sensing amplifier connected to the first and second sense lines which are connected to the first and second bit lines through the first switch in a conducting state after the first word line is selected, thereby causing the first sensing amplifier to amplify a potential difference between the first and second sense lines and to latch data indicating the amplified potential difference:

deselecting the first word line to rewrite the data into a memory cell while the first sensing amplifier latches the data after a read command is input;

putting the first and second switches into a non-conducting state to precharge the first and second bit lines separated from the first and second sensing amplifiers;

reading the data from the first sensing amplifier to the first data bus through the third switch; putting the second switch to a conducting state while the data is being read to the first data bus, to precharge the first and second bit lines and the third and fourth sense lines connected to the first and second bit lines;

putting the first switch into a non-conducting state and putting the second switch into a conducting state when the second word line is selected after a second active command is input;

activating only the second sensing amplifier connected to the third and fourth sense lines which are connected to the second switch, thereby causing the second sensing amplifier to amplify a potential difference between the third and fourth sense lines and to latch data indicating the amplified potential difference;

deselecting the second word line to rewrite the data into a memory cell while the second sensing amplifier latches the data after a read command is input;

putting the first and second switches into a non-conducting state, to precharge the first and second bit lines separated from the first and second sensing amplifiers;

reading the data from the second sensing amplifier to the second data bus through the fourth switch; and putting the first switch into a conducting state while the data is being read to the second data bus, to precharge the first and second bit lines and the first and second sense lines connected to the first and second bit lines.

10. A method for controlling a semiconductor memory device according to claim 9, wherein the semiconductor memory device is synchronized with a clock.

* * * * *